United States Patent [19]

Fang et al.

[11] 4,012,646
[45] Mar. 15, 1977

[54] POWERING SCHEME FOR JOSEPHSON LOGIC CIRCUITS WHICH ELIMINATES DISTURB SIGNALS

[75] Inventors: Frank Fu Fang, Yorktown Heights; Dennis James Herrell, Somers, both of N.Y.

[73] Assignee: International Business Machines Corporation, Armonk, N.Y.

[22] Filed: June 30, 1975

[21] Appl. No.: 591,997

[52] U.S. Cl. ............................ 307/306; 307/212; 307/277; 357/5

[51] Int. Cl.² ............... H03K 3/38; H03K 17/92; H03K 19/195

[58] Field of Search ............... 307/212, 277, 306; 357/5

[56] References Cited

OTHER PUBLICATIONS

W. Anacker, "Resetting Scheme for Josephson Tunnelling Combinatorial Logic Network", IBM Technical Disclosure Bulletin, vol. 16, No. 10, Mar. 1974, pp. 3400–3401.

Primary Examiner—John Zazworsky
Attorney, Agent, or Firm—Thomas J. Kilgannon, Jr.

[57] ABSTRACT

A Josephson junction terminated line logic powering scheme is disclosed wherein a logic gate and a regulating gate are utilized in at least a single logic circuit to provide a constant voltage to the logic circuit. The circuit comprises a terminated line logic gate with its associated sense gate and a regulating gate in series with the logic gate. When the logic gate is switched to the voltage state, it sends a disturb signal up and down the line which carries the gate current to the logic devices. A regulator gate which has already been biased to the voltage state is reset to the zero voltage state by the disturb signal. The resetting of the regulator gate sends out a disturb signal which cancels the original disturb signal with a small delay. The result of the combination of the disturbance generated by the logic gate and the regulating gate is an extremely narrow pulse with a maximum width equal to the round trip delay between the adjacent gates having an amplitude of $I-I_{min}$. In the steady state, the total voltage drop across the supply line remains constant before and after logic operations. Thus, d.c. regulation problems are eliminated.

Using the above approach for powering logic gates, it is possible to reset the logic gates by applying a control pulse to the regulating gates so that all of these gates which are in the zero voltage state will be switched to the voltage state. The disturbance resulting from this switching action resets the adjacent logic gate in the same manner as the logic gate disturbance resets the regulator gate. Regulating gates initially in the voltage state will not be affected by this operation.

19 Claims, 7 Drawing Figures

LOGIC GATE 12
WITH IMPEDANCE 13

REGULATOR GATE 18

POWERING SCHEME FOR JOSEPHSON LOGIC CIRCUITS WHICH ELIMINATES DISTURB SIGNALS

BACKGROUND OF THE INVENTION

1. Field of the Invention

This invention relates generally to Josephson tunneling logic circuits and is more specifically related to logic arrays utilizing Josephson tunneling junctions. Still more specifically, it relates to logic circuits wherein isolation and resetting of the logic gate utilizes active devices. The active device isolation and resetting means, in the form of a switchable Josephson junction, provides for affirmative control of the resetting of the logic gate while at the same time providing for d.c. regulation of a string of such logic circuits. The ability to reset latching logic gates locally eliminates the necessity for interrupting power supply currents which are the usual manner for resetting logic circuits which latch. As a result, perfect d.c. regulation for any number of gates in a string may be achieved. Further, the ability to reset locally means fast cycle time and ease of gate current supply requirements.

2. Description of the Prior Art

Josephson junction devices and Josephson junction logic circuits are well known in the prior art. The problem of eliminating cross-talk between Josephson devices in Josephson logic arrays, which are due to current transients when a device switches, is also well known. The resetting of logic circuits locally while simultaneously minimizing cross-talk due to current transients has been addressed in a copending application entitled "Low Cross-talk Automatic Resetting Scheme for Josephson Junction Logic Circuit" in the name of H. H. Zappe, Ser. No. 540,762, filed Jan. 14, 1975, which is a continuation of application Ser. No. 422,959, filed Dec. 7, 1973, now abandoned, and assigned to the same assignee as the present application. In that application, logic circuit isolation and resetting is achieved by the use of passive impedances disposed in the gate current feeder lines of the logic circuit. The use of high and low impedance portions of the gate current feeder line also provides for resetting of a switched Josephson logic circuit without the need for altering the d.c. current supplied to the gate current feeder line. The present application is distinguishable over the above mentioned copending application in that the present application utilizes an active device which is responsive to the presence of disturb signals or current transients which cause the active device to reset, thereby generating a disturb signal or current transient which cancels the original disturb signal or current transient with a small delay. Because the active device is now in the zero voltage state, it would have no effect on subsequent disturb signals and, as a result, must be switched to the voltage state. This can be accomplished by the use of a separate bias line which permits a flexibility not attainable using passive devices, i.e., control of the resetting of the logic gate by actuation of the active regulator gate whose disturb signal resets the logic gate and prepares the latter for the next cycle of operation.

SUMMARY OF THE INVENTION

In accordance with the broadest aspects of the present invention, a Josephson junction circuit is provided which includes at least a single Josephson junction adapted for switching from a zero voltage state to a finite voltage state, and further includes active means disposed in series with the junction for resetting the junction from the finite voltage state to the zero voltage state.

In accordance with the broadest aspects of the invention, a Josephson junction circuit is provided which includes at least a single Josephson junction adapted for switching from the zero voltage state to the finite voltage state wherein the switching produces current pulse transients and further includes active means disposed in series with the junction for providing a mismatch to said current pulse transient.

In accordance with broader aspects of the present invention, a Josephson junction circuit array is provided which includes at least two Josephson junctions connected in series and further includes active means disposed between said two junctions for reducing crosstalk between said two junctions.

In accordance with more specific aspects of the present invention, the active means includes another Josephson junction disposed between the two Josephson junctions. It further includes biasing means for switching said another Josephson junction device from the zero voltage state to the voltage state, preparatory to activating the above mentioned two Josephson junctions.

It is, therefore, an object of the present invention to provide at least a single Josephson logic circuit wherein active means in the form of a regulator Josephson junction is provided for affirmatively resetting a latched logic circuit.

It is another object to provide a Josephson logic array having reduced cross-talk.

It is a further object to provide a Josephson logic array in which transients due to the switching of any Josephson junction are regulated locally within the logic circuit.

It is a still further object of the present invention to provide a Josephson logic array in which perfect d.c. regulation for any number of gates in a string is achieved while simultaneously providing for controlled resetting of a switched logic gate.

Still another object is to provide a Josephson logic array in which resetting of a Josephson logic gate and the elimination of cross-talk is controlled by a regulator Josephson junction.

The foregoing and other objects, features and advantages of the invention will become apparent from the following more particular description of the preferred embodiment of the invention as illustrated in the accompanying drawings.

DETAILED DESCRIPTION OF PREFERRED EMBODIMENTS

Figure 1:
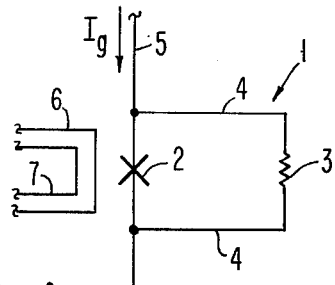
FIG. 1 is a schematic drawing of a typical Josephson junction logic circuit which includes at least two control conductors.

Referring now to FIG. 1, there is shown a schematic drawing of a typical logic circuit 1 which includes a Josephson junction device 2 shunted by an impedance 3 having a value which is equal to twice the characteristic impedance of transmission lines 4. The latter connect impedance 3 to gate current feeder line 5 which delivers gate current, $I_g$, to Josephson device 2. The switching of Josephson device 2 is controlled by a pair of control lines 6,7 which may be connected to preceding logic circuits similar to logic circuit 1.

Logic circuits similar to logic circuit 1 are broadly characterized as terminated line logic circuits and they may be terminated by impedances which have resistance values which permit circuit 1 to operate in both latching and non-latching modes.

When Josephson junction 2 is in the superconducting state with current, $I_g$, flowing therethrough via gate current feeder line 5, the voltage drop across junction of device 2 is equal to zero and all the gate current, $I_g$, flows in Josephson device 2. When the appropriate inputs are applied to control lines 6,7, which reduce the switching threshold of Josephson junction 2, junction 2 switches to the voltage state and the voltage across the junction becomes $v=2\Delta/e$, where $2\Delta/e$ is the gap voltage. An output current equal to $2\Delta/eZ$ then flows in impedance 3. Where Z is matched to the characteristic impedance of transmission lines 4, output current appears in impedance 3 substantially immediately.

When the inputs are removed from control lines 6,7, Josephson junction 2 may or may not reset to the zero voltage state depending on whether or not the resistance of impedance 3 is sufficiently small to permit resetting. With appropriate values of resistance, as is well known in the art, Josephson junction 2 will be self-resetting if the current in Josephson junction 2 falls to a value below $I_{min}$. Where circuit 1 is of the latching type, Josephson junction 2 must be reset by reducing the gate current, $I_g$, to some value less than $I_{min}$.

Figure 2:
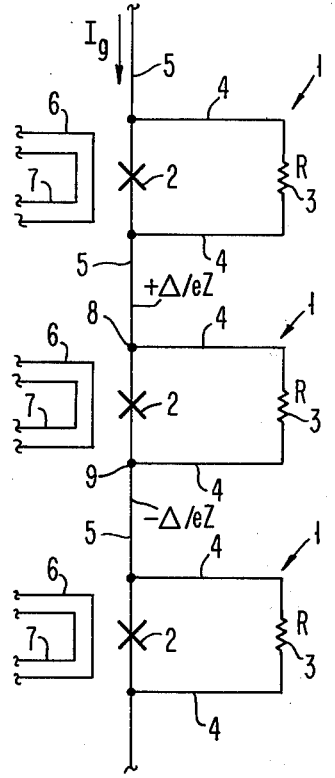
FIG. 2 is a schematic drawing of a portion of a Josephson logic array having three Josephson logic devices connected in series therein which is utilized to illustrate the problems encountered in such circuits due to the propagation of disturb signals when a logic gate switches.

Logic circuit 1 standing alone presents no particular problem to the circuit designer, except when circuits similar to that shown in FIG. 1 are formed into a series array similar to that shown in FIG. 2. FIG. 2 shows a plurality of logic circuits arranged in series the Josephson junctions 2 of which are all fed in series by gate current feeder line 5. When logic circuits 1 are connected in series in a logic array, disturb signals or transients generated by the switching of Josephson junction 2 create the problem of cross-talk inasmuch as the disturb signals or transients flow via portions of gate current feeder line 5 into adjacent Josephson junctions 2 interfering with the normal operation of these adjacent junctions.

Referring now to FIG. 2, the problem of disturb signals or transient currents can be appreciated from a consideration of the serially arranged logic circuits 1. In the array shown, all the Josephson junction devices are fed the same gate current, $I_g$, from a single source. Each of the logic circuits 1 may be individually actuated by their associated control lines 6,7. Upon the switching of any of the Josephson junctions 2 to the voltage state, gate current, $I_g$, is delivered into the associated impedance 3 and Josephson junction device 2 remains in the voltage state where the circuit operates in the latching mode. The resulting current flow through impedance 3 can be utilized to represent one of two binary conditions and may itself be an output or transmission lines 4 may serve as a control line input to a subsequent Josephson device in a different logic array. Where the current flow represents an output, this is usually detected by a separate Josephson junction utilized as a sense gate in a circuit which contains means responsive to the change in voltage across the sense gate. When any of the Josephson junction devices 2 switch to the voltage state, voltage transients $+\Delta/e$ and $-\Delta/e$ appear at points 8,9, for example, in FIG. 2. Current pulse transients or disturb signals associated with the voltage transients are transmitted via gate current feeder line 5 to the adjacent transmission lines 4 of the upper and lower logic circuits 1 shown in FIG. 2. Under such circumstances, transient currents or disturb signals may be carried via transmission lines 4 to impedances Z and can represent a spurious logic output or act as a spurious input to a succeeding Josephson device where transmission lines 4 are utilized as control line inputs to a succeeding logic circuit. Furthermore, the disturb current passing through other such logic gates will affect their proper operation such that erroneous switching might occur. In the usual operating conditions for arrays similar to that shown in FIG. 2, there are conflicting requirements for circuit power supplies arising from the need for fast set-reset cycles and the localizing of disturb signals or current transients which result from logic gate switching. Also, where a plurality of Josephson devices 2 switch, static regulation usually suffers because of the loading on gate current feeder line 5.

Figure 3:
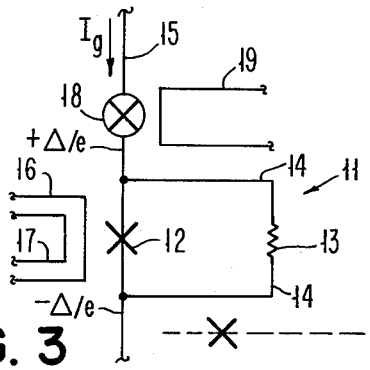
FIG. 3 shows a schematic drawing of a single logic circuit incorporating the logic gate and regulator gate of the present invention. The regulator gate is a Josephson junction device which is actuable by its own control line.
Figure 4A:
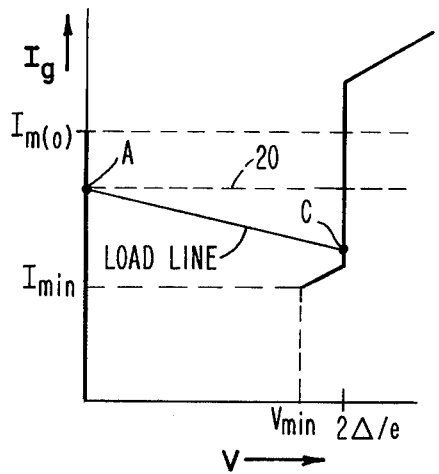
FIG. 4A is a graphical representation showing the I-V characteristic of the logic gate shown in FIG. 3.
Figure 4B:
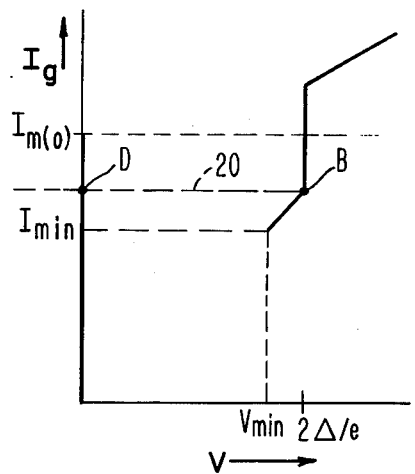
FIG. 4B is a graphical representation showing the I-V characteristic of the regulator gate shown in FIG. 3.

FIG. 3 shows a schematic of a logic circuit 11 incorporating a single logic gate and a regulator gate in accordance with the teaching of the present invention which is subject to none of the above conflicting requirements. FIG. 3 should be considered in connection with FIGS. 4A and 4B which show the I-V characteristics of logic gate 12 and regulator gate 18, respectively. Logic circuit 11 comprises a Josephson junction device 12 shunted by a load impedance 13 which is connected via transmission lines 14 to a gate current feeder line 15 over which gate current, $I_g$, is fed to Josephson junction 12. Control lines 16,17 control the switching threshold of Josephson junction 12 in the same manner described in connection with FIG. 1. A regulator gate 18, otherwise schematically shown in FIG. 3 as a circled X is disposed in gate current feeder line 15 in series with Josephson junction 12. Regulator gate 18 is controlled by a bias line 19, current through which independently controls the switching of regulator gate 18. Josephson junction 12 otherwise characterized as a logic gate, has the usual terminated line logic properties and, for purposes of the present explanation, should be considered to be operable in the latching mode. A typical I-V characteristic for logic gate 12 shunted by an impedance 13 is shown in FIG. 4A. The I-V characteristic of regulator gate 18 shown in FIG. 4B has hysteresis. Circuit 11 is operated at a gate current, $I_g$, which is between $I_{m(o)}$ and $I_{min}$ of both gates as indicated by dashed lines 20 which extends across the I-V characteristics shown in FIGS. 4A and 4B. In operation, the logic gate 12 is first brought to the zero voltage state condition and regulator gate 18 is brought to the voltage state. Thus, logic gate 12 is operating at point A in FIG. 4A while regulator gate 18 is operating at point B in FIG. 4B. This can be accomplished by applying bias to control line 19 of regulator gate 18, as will be more fully explained hereinafter, during a reset interval. When logic gate 12 is switched by applying control signals to control lines 16,17, logic gate 12 switches to the voltage state and now operates at point C on the I-V characteristic of FIG. 4A. The switching of logic gate 12 results in a disturb signal in the form of a current reduction of $\Delta/eZ$ which propagates up and down gate current feeder line 15 in FIG. 3. The disturb signal or current transient causes regulator gate 18 to switch back to the zero voltage state for a regulator gate which is designed such that $I-I_{min} < \Delta/eZ$. The resetting to the zero voltage state of regulator gate 18 generates a disturb signal which is opposite in polarity that in turn cancels the original disturb current with a small delay. The result of the combination of disturbances generated by logic gate 12 and then by regulator gate 18 is an extremely narrow pulse with a maximum width equal to the round trip delay between gates 18,12, with an amplitude equal to $I-I_{min}$. These pulses are degraded by the parasitic inductance and capacitance of gate current feeder line 15 and no longer have an amplitude sufficient to disturb the next set of logic, regulating gates 12,18, respectively. Regulator gate 18 switches to the zero voltage state as a result of the disturb signal from the switching of logic gate 12 because the value of current seen by regulator gate 18 has been instantaneously reduced to a value below $I_{min}$ and consequently resets at point D as shown in FIG. 4B. At this point, it should be recalled that logic gate 12 is at point C, in a latched condition, as shown in FIG. 4A. From a consideration of both FIGS. 4A and 4B, it should be clear that while one gate is in the zero voltage state, the other gate is in the voltage state. Thus, in the steady state, the total voltage drop across gate current feeder line 15 is the same and remains constant both before and after logic switching. In fact, each logic circuit 11 consisting of a single logic gate 12 and regulator gate 18 maintains a constant voltage, $2\Delta/e$ at all times, thereby eliminating d.c. regulation problems.

When logic device 12 in FIG. 3 switches, it effectively generates two disturb signals, $+\Delta/e$ and $-\Delta/e$, as shown in FIG. 3. The former of these disturb signals opposes the direction of gate current, $I_g$, so that, upon encountering regulator gate 18, it effectively reduces the gate current flowing therethrough causing gate 18 to switch to the zero voltage state (it being assumed that gate 18 had previously been set to the voltage state by applying a bias on control line 19). When regulator gate 18 switches to the zero voltage state, similar but opposite polarity disturb signals to that generated by gate 12 are generated by regulator gate 18. The effectively negative disturb signal which is reflected from gate 18 which now represents a mismatch in gate current transmission line 15 undergoes a reversal and now appears as an effectively positive disturb signal. This positive disturb signal interacts with the negative disturb signal emanating from regulator gate 18 and effectively results in cancellation of the disturb signal with a small delay. Logic gate 12 has now been switched to the voltage state, delivering current to load or impedance 13 and regulator gate 18 is in the zero voltage state.

Figure 5:
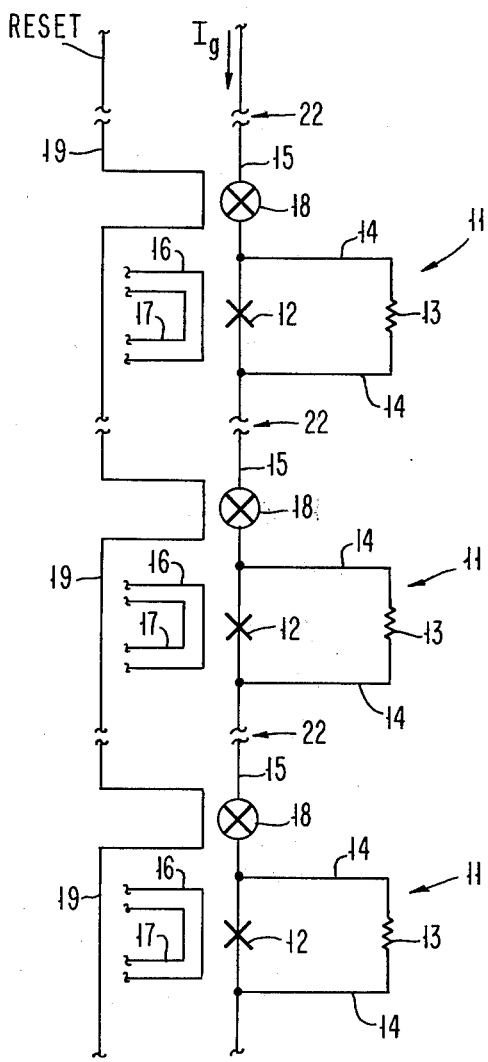
FIG. 5 shows a schematic drawing of a logic array incorporating a plurality of circuits similar to that shown in FIG. 3.

The same approach of using active devices to set a logic gate can be utilized to reset it. This is accomplished by applying a control pulse to control line 19 which reduces its effective switching threshold, causing gate 18 to switch to the voltage state. In a manner similar to that described hereinabove in connection with the switching of logic gate 12, disturb signals $+\Delta/e$ and $-\Delta/e$ are generated by the switching of gate 18. In this instance, the $-\Delta/e$ component effectively reduces the gate current through logic gate 12 below its minimum value of current, and gate 12 resets to the zero voltage state without further disturbance to the other logic gates. Using this approach for latching logic circuits, it should be clear that resetting of a logic gate 12 can be strictly controlled by the timing of a reset pulse on control line 19 of regulator gate 18. The present approach utilizing latching circuits provides for perfect d.c. regulation and also overcomes the necessity for dropping gate current, $I_g$, below $I_{min}$, and the disturbance associated with the powering up in order to reset the latching circuit.

Where the circuit involved consists of a single logic gate as shown in FIG. 3, the operation of circuit 11 is relatively straightforward and no consideration need be given to potential interactions of disturb signals with other devices. Where, however, a plurality of logic circuits 11 are utilized in a series string, consideration must be given to the effect of disturb signals propagated by one logic circuit 11 on the operation of an adjacent logic circuit 11. As has been shown hereinabove in connection with FIG. 3, the disturb signals propagated by the switching of a logic gate 12 are effectively negative in character regardless of their direction of propagation from a logic gate 12, and all regulator gates 18 in a series string of logic circuits 11 would encounter a total current which is effectively reduced from the value of gate current. If regulator gates 18 were all spaced the same distance from a logic gate 12, the regulator gates would switch at the same time to the zero voltage state resulting in the undesired operation of an additional regulator gate 18. This problem can be overcome by adjusting the length and impedance of a portion of gate current feeder line 15 between the logic gate of one logic circuit 11 and the regulator gate 18 of another logic circuit 11. Using this approach, the amplitude of the disturb signal is attenuated to the extent that the combination of gate current and disturb current through an adjacent regulator gate does not fall below $I_{min}$ of that regulator gate. Thus, in FIG. 5, breaks 22 are intended to convey the fact that in the regime where a series of logic circuits 11 are utilized, the attenuation between series circuits should be such that no spurious interactions are possible between disturb signals from adjacent logic circuits 11.

The characteristics assumed for the logic gates 12 and regulator gates 18 shown in FIGS. 4A and 4B, respectively, can be obtained in the following way. For logic device 12, the characteristic is simply that obtained with a terminating resistor 13 in parallel with logic gate 12. The characteristic of regulator gate 18 can be obtained either by a low resistance in parallel with gate 18 or by using a weak link in parallel with a Josephson junction. Where it appears to be difficult to design regulator gate 18 such that the voltage change matches the logic device voltage change, more than one regulator gate 18 per logic circuit 11 may be utilized.

In summary, the design requirements are:

$$I - I_{min} \text{ (regulator)} < \Delta/eZ \tag{1}$$

For resetting logic gate 12 upon switching of regulator gate 18 from the zero voltage state to the voltage state by suppressing $I_{m(o)}$ and $I_{min}$ of regulator gate 18, it is required that $$I - I_{min} \text{ (logic)} < \frac{2\Delta}{eR} + \frac{\Delta}{eZ}$$

where R is equal to the terminal resistance of the logic circuit designated as 13 in the FIGS.

Figure 6:
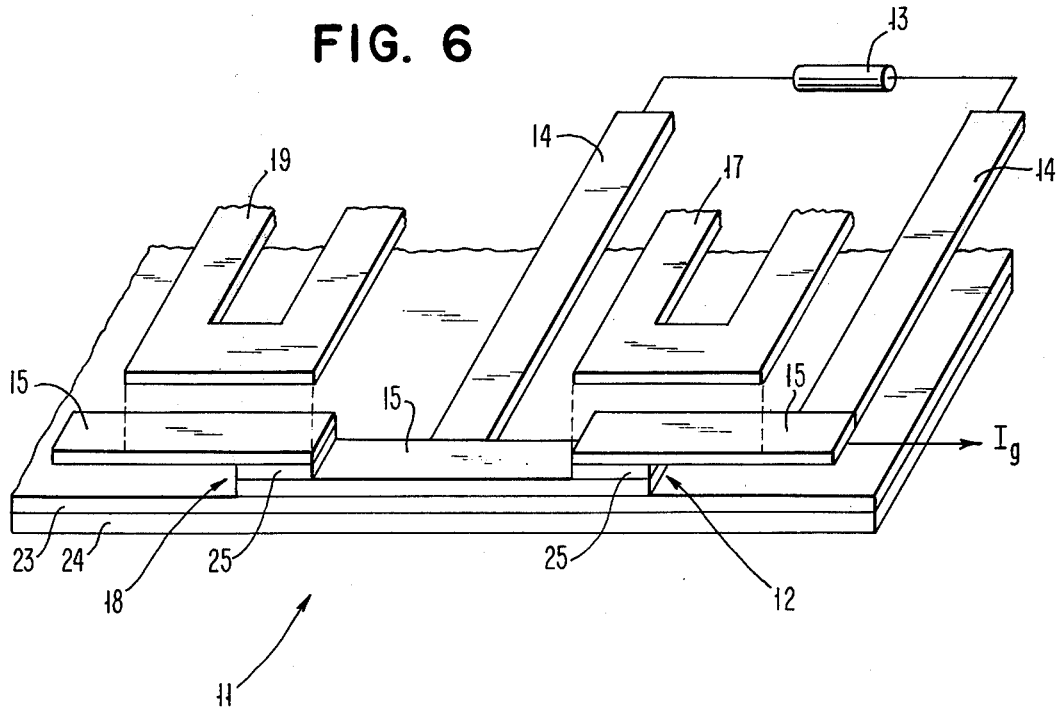
FIG. 6 shows a perspective drawing of a logic-regulator gate which may be utilized in the practice of the present invention.

Referring now to FIG. 6, there is shown therein a perspective drawing of a logic circuit similar to that shown in FIG. 3 which incorporates a logic gate and a regulator gate in accordance with the teaching of the present invention. The same reference numbers have been utilized in FIG. 6 to identify the same elements as shown in FIG. 3. In FIG. 6, logic circuit 11 is disposed on an insulating layer 23 which, in turn, is disposed on a superconducting ground plane 24. Gate current feeder line 15 is disposed on insulating layer 23. Portions of line 15 are utilized as base electrodes for devices 12,18 and, using well-known photolithographic masking and oxidation techniques, tunnel barriers 25 are formed on portions of line 15. Again, using well-known photolithographic masking and etching techniques, portions of superconducting lines 15 disposed over tunnel barriers 25 are utilized as counter electrodes. Transmissions lines 14 are formed at the same time as the portions of feeder line 15 to which they are attached. Terminal impedance 13 which may be an extension of transmission lines 14 can form a desired characteristic impedance in a manner well known to those skilled in the transmission line art and may have a desired resistance by using a normal metal or by ion implantation to change a superconducting material to a normal metal at liquid helium temperatures. Thus, for example, the characteristic impedance of a transmission line may be decreased by increasing the width of the superconductor relative to the width of transmission lines 14 or alternatively the thickness of dielectric or the dielectric constant of the insulator may be controlled. A layer of insulation (not shown) is disposed over devices 12,18, transmission lines 14,15 and impedance 13. Finally, control lines 17 and 19 are formed by depositing a layer of metal atop the last mentioned insulating layer and delineating these control lines by well known photolithographic masking and etching techniques.

From the foregoing, it should be clear that logic arrays incorporating a large number of separate logic circuits similar to logic circuits 11 may be fabricated on a single substrate and that many logic functions, such as OR, NOR, NAND, etc., in addition to the AND function described hereinabove, may be carried out utilizing the teaching of the present invention.

While the invention has been particularly shown with reference to a preferred embodiment thereof, it will be understood by those skilled in the art that the foregoing and other changes in form and details may be made therein without departing from the spirit and scope of the invention.

What is claimed is:

1. A Josephson junction circuit comprising at least a single latching Josephson junction adapted for switching from a zero voltage state to a finite voltage state, and means disposed in series with said junction for generating a pulse transient having an amplitude sufficient to reset said junction from the finite voltage state to the zero voltage state said means for generating and said junction having a total voltage drop equal to the voltage of said finite voltage state prior to and after resetting said junction.

2. A Josephson junction circuit according to claim 1 further including a load impedance shunting said at least a single Josephson junction.

3. A Josephson junction circuit according to claim 1 further including at least a single control line electromagnetically coupled to said at least a single Josephson junction.

4. A Josephson junction circuit according to claim 1 wherein said means for generating a pulse transient includes a latching Josephson junction device having a zero voltage state and a voltage state the actuation of which to the voltage state resets said junction to the zero voltage state when said junction is in the finite voltage state.

5. A Josephson junction circuit according to claim 4 further including bias means electromagnetically coupled to said device for switching said device to the voltage state.

6. A Josephson junction circuit comprising at least a single latching Josephson junction adapted for switching from a zero voltage state to a finite voltage state said switching producing a current pulse transient, and,
    active means disposed in series with said junction for providing a mismatch to said current pulse transient for reflecting at least a portion of said current pulse transient said active means and said junction having a total voltage drop equal to the voltage of said finite voltage state prior to producing and after reflecting said current pulse transient.

7. A Josephson junction circuit according to claim 6 further including a load impedance shunting said at least a single Josephson junction.

8. A Josephson junction circuit according to claim 6 further including at least a single control line electromagnetically coupled to said at least a single Josephson junction.

9. A Josephson junction circuit according to claim 6 wherein said active means for providing a mismatch to said current pulse transient includes a Josephson junction device having a zero voltage state and a voltage state the latching of which in the latter state presents a mismatch to said current pulse transient to reflect at least a portion thereof.

10. A Josephson junction circuit according to claim 9 further including bias means electromagnetically coupled to said device for switching said device to the voltage state.

11. A Josephson junction circuit according to claim 9 wherein said current pulse transient has a magnitude sufficient to reset said device to the zero voltage state generating an additional current pulse transient of magnitude and polarity sufficient to substantially cancel said at least a portion of said current pulse transient.

12. A Josephson junction array comprising at least two latching Josephson junctions connect in series so that crosstalk in the form of pulse transients can pass therebetween said junctions having a zero voltage state and a finite voltage state and pulse transient generating means actuated by the switching of one of said junctions disposed between said two junctions for reducing the crosstalk between said two junctions said pulse transient generating means and one of said junctions have a total steady-state voltage drop equal to the voltage of said finite voltage state both prior to and after actuation of said pulse transient generating means.

13. A Josephson junction array according to claim 12 further including a load impedance shunting each of said at least two junctions.

14. A Josephson junction array according to claim 12 further including at least a single control line electromagnetically coupled to each of said at least two junctions.

15. A Josephson junction array according to claim 12 wherein said pulse transient generating means for reducing cross-talk includes a latching Josephson junction device having a zero voltage state and a voltage state the switching of which into the former state substantially cancels a disturb signal generated by the switching of one of said junctions.

16. A Josephson junction array according to claim 15 further including bias means electromagnetically coupled to said device for switching said device to the voltage state.

17. A Josephson junction array according to claim 15 further including means for resetting one of said two junctions to the zero voltage state.

18. A Josephson junction array according to claim 17 wherein said means for resetting includes means for setting said device from the zero voltage state to the voltage state.

19. A Josephson junction array according to claim 18 wherein said means for setting includes control means electromagnetically coupled to said device for switching said device to the voltage state.

* * * * *